United States Patent
Akutsu

(10) Patent No.: US 9,970,124 B2
(45) Date of Patent: May 15, 2018

(54) SINGLE CRYSTAL PRODUCTION APPARATUS AND SINGLE CRYSTAL PRODUCTION METHOD

(71) Applicant: Shin Akutsu, Kodaira (JP)

(72) Inventor: Shin Akutsu, Kodaira (JP)

(*) Notice: Subject to any disclaimer, the term of this patent is extended or adjusted under 35 U.S.C. 154(b) by 39 days.

(21) Appl. No.: 15/107,095

(22) PCT Filed: Mar. 13, 2015

(86) PCT No.: PCT/JP2015/057540
§ 371 (c)(1),
(2) Date: Jun. 21, 2016

(87) PCT Pub. No.: WO2016/147265
PCT Pub. Date: Sep. 22, 2016

(65) Prior Publication Data
US 2017/0114474 A1   Apr. 27, 2017

(51) Int. Cl.
*C30B 13/16* (2006.01)
*C30B 13/24* (2006.01)
(Continued)

(52) U.S. Cl.
CPC .............. *C30B 13/24* (2013.01); *C30B 13/16* (2013.01); *C30B 13/22* (2013.01); *C30B 13/285* (2013.01); *C30B 13/32* (2013.01); *C30B 29/66* (2013.01)

(58) Field of Classification Search
CPC .......... C30B 13/00; C30B 13/16; C30B 13/22
See application file for complete search history.

(56) References Cited

U.S. PATENT DOCUMENTS

| 4,218,282 A | * | 8/1980 | Kochi | ................... | C30B 13/00 |
| | | | | | 117/50 |
| 6,387,178 B1 | * | 5/2002 | Geho | ...................... | C30B 13/24 |
| | | | | | 117/43 |
| 2002/0112659 A1 | * | 8/2002 | Sekijima | ................. | C30B 13/00 |
| | | | | | 117/50 |

FOREIGN PATENT DOCUMENTS

| JP | S 63-274685 A | 11/1988 |
| JP | H 07-069774 A | 3/1995 |

(Continued)

OTHER PUBLICATIONS

International Search Report (ISR) (PCT Form PCT/ISA/210), in PCT/JP2015/57540, dated Jun. 16, 2015 (with partial English translation).

(Continued)

*Primary Examiner* — Robert M Kunemund

(74) *Attorney, Agent, or Firm* — McGinn IP Law Group, PLLC.

(57) ABSTRACT

A single crystal production apparatus (and a single crystal production method) is configured to produce a single crystal by approaching a raw material M gripped by a raw material grip portion, and a seed crystal S gripped by a seed crystal grip portion by disposing the raw material grip portion and the seed crystal grip portion mutually in a vertical direction and approaching both of them each other, and forming a melting zone M1 by making a portion melted by heating the raw material M by a heating part in contact with the seed crystal S, and cooling the melting zone, wherein the heating part has an infrared generating part, and the seed crystal grip portion is disposed at a vertically top position, and the raw material grip portion is disposed at a vertically bottom position.

9 Claims, 9 Drawing Sheets

(51) Int. Cl.
*C30B 13/22* (2006.01)
*C30B 13/32* (2006.01)
*C30B 29/66* (2006.01)
*C30B 13/28* (2006.01)

(56) References Cited

FOREIGN PATENT DOCUMENTS

| | | |
|---|---|---|
| JP | H 07-315979 A | 12/1995 |
| JP | H 10-251088 A | 9/1998 |
| JP | 2011-144081 A | 7/2011 |

OTHER PUBLICATIONS

Translation of English PCT/ISA/237 Form, dated Jun. 16, 2015.

* cited by examiner

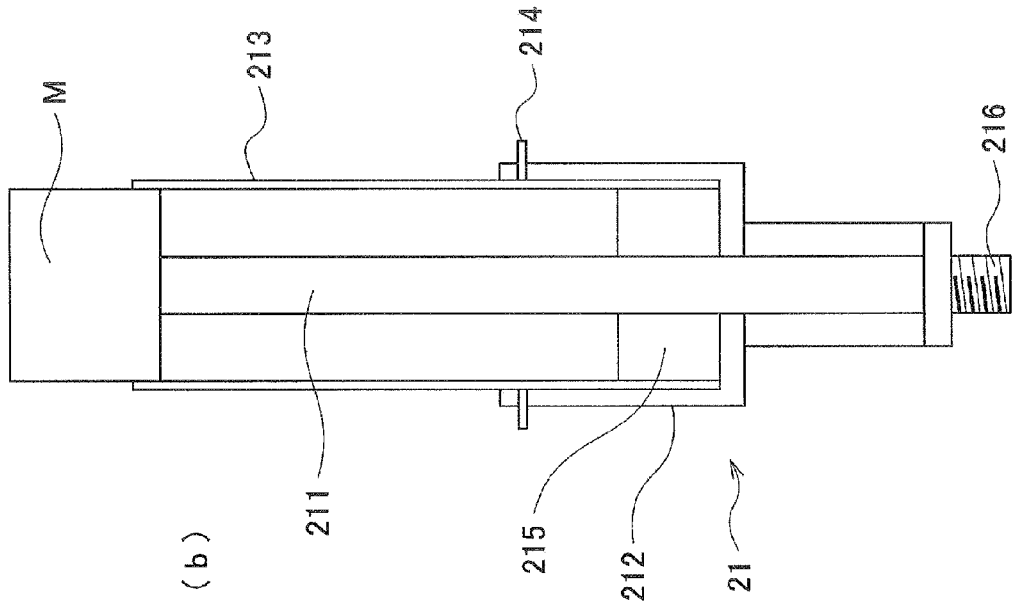
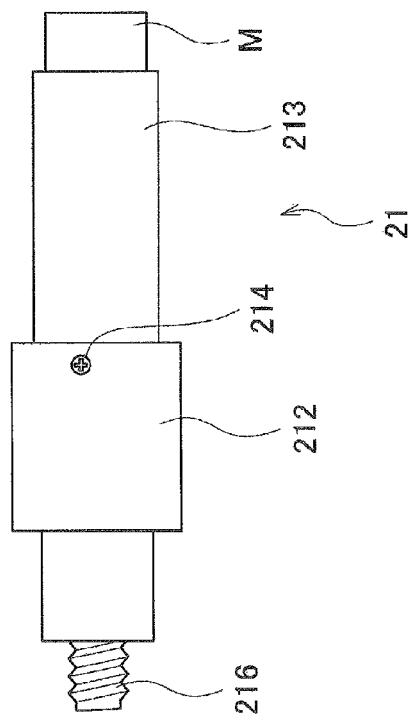
FIG. 3 (a)
FIG. 3 (b)

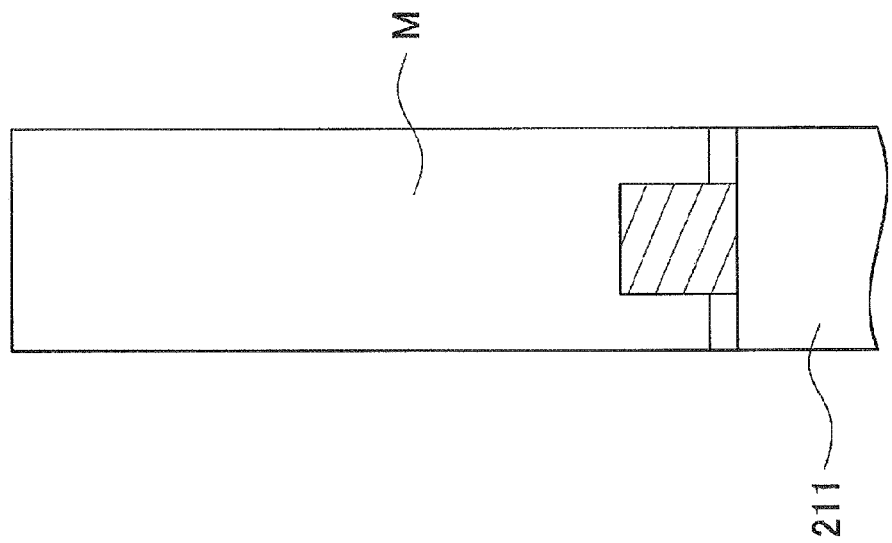
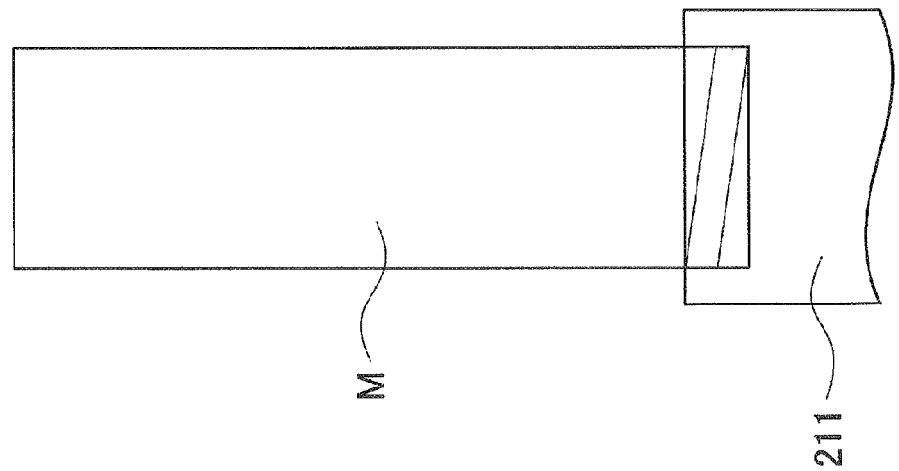

SINGLE CRYSTAL PRODUCTION APPARATUS AND SINGLE CRYSTAL PRODUCTION METHOD

TECHNICAL FIELD

The present invention relates to a single crystal production apparatus and a single crystal production method, and more specifically relates to an apparatus and a method for producing a single crystal by melting a raw material using an infrared.

DESCRIPTION OF RELATED ART

Conventionally, a floating zone method (melting zone method) using a centralized heating by an infrared lamp, is known as the single crystal production method (for example, patent document 1).

According to a configuration described in patent document 1, the infrared lamp is disposed at one focal point of a spheroidal mirror. Then, a rod-like raw material is disposed at the other focal point. At this time, the rod-like raw material is disposed in a vertically top direction (referred to as an upper part hereafter), and a rod-like seed crystal is disposed in a vertically bottom direction (referred to as a lower part hereafter), and thereafter the raw material and the seed crystal are approached to each other. Then, a melting zone is formed using an infrared emitted from the infrared lamp and the melting zone is cooled, to thereby grow a single crystal. In this method, a relatively inexpensive infrared lamp is used, and a crucible is not used irrespective of the single crystal production apparatus, and therefore a cost for producing the single crystal can be reduced.

Incidentally, according to the floating zone method, a production technique of the single crystal has been changed from a heating by the infrared lamp to a heating using the infrared lamp and a laser together (for example patent document 2) or to a heating characterized by using a laser beam (for example, patent document 3).

PRIOR ART DOCUMENT

Patent Document

Patent document 1: Japanese Patent Laid Open Publication No. 1988-274685
Patent document 2: Japanese Patent Laid Open Publication No. 1995-315979
Patent document 3: Japanese Patent Laid Open Publication No. 2011-144081

SUMMARY OF THE INVENTION

Problem to be Solved by the Invention

Patent documents 2 and 3 suggest a point that the technique has been changed from the heating by the infrared lamp to the heating by the laser beam.

For example, in patent document 2, spot heating is performed to the raw material by the laser beam, while heating the raw material by the infrared lamp.

Patent document 2 gives a reason for performing the spot heating as follows: there is an effect of providing a steep temperature gradient in a solid-liquid interface between a melted raw material (melting zone) and a raw material in a solid state, and between the melted raw material and a seed crystal (paragraph (0008) of the patent document 2). Then, the melting zone is not unnecessarily long. As a result, the melted raw material is not sagged by its own weight, extending to the seed crystal disposed in a lower part of the melting zone, and the melting zone can be stably maintained. This is described in the same paragraph (0008).

Further, patent document 3 dedicated to the heating by laser beams, teaches that although the raw material is completely melted in a light converging portion by the infrared lamp, the temperature is low in its circumference, and therefore a partial melting occurs. Therefore, a coexistence part of a solid portion and a liquid portion is generated in the raw material, and due to expansion of this part in the production step of the single crystal, the shape and the size of the single crystal is not stable (paragraph (0005) of patent document 3).

Patent document 3 also teaches that, by performing heating using the laser beam, the melting zone is maintained in a high temperature, and the solid portion other than the melting zone is sufficiently maintained in a low temperature, thus reducing the partial melting and suppressing the sagging from the melting zone to the single crystal while being solidified (paragraphs (0020) and (0063) of patent document 3).

Meanwhile, when the raw material is heated using the infrared lamp (halogen lamp) without using the laser beam, patent document 3 teaches that not only the sagging from the melting zone to the single crystal while being partially melted and solidified, but also the sagging from the melting zone to the seed crystal occurs (conventional example described in paragraph (0064) of patent document 3).

In view of the above mentioned content, first, a problem common in patent documents 2 and 3 is that in the floating zone method using the infrared lamp as described in patent document 1, there is a possibility that "sagging from the melting zone" occurs. In any way, in order to prevent such a sagging from occurring, spot heating by the laser beam is performed.

It is true that the spot heating by the laser beam by the floating zone method can make a steep temperature gradient of the solid-liquid interface, and the melting zone is not required to be long unnecessarily. Therefore, there is less possibility of damaging a quality of the produced single crystal and in addition damaging the seed crystal due to the sagging of the melting zone.

However, it is found by the inventors of the present invention, that the single crystal production method using the laser beam by the floating zone method is not always universal. The problems found by the inventors of the present invention are as follows.

(Problem 1) Since a laser source is required, an apparatus is more expensive than an apparatus using the infrared lamp.
(Problem 2) In the technique using the conventional floating zone method (for example, patent documents 1 to 3), a considerable skill is required for performing a work of growing the single crystal while controlling the melting zone, and if the work is failed, there is a great risk of damaging the seed crystal in the lower part.

In recent years, the single crystal production apparatus has been popular not only in Japan but also in overseas including Asia, mainly in a research institute. Under such a circumstance, the above mentioned problem 1 and problem 2 become remarkable.

As the problem 1, the single crystal production apparatus using the laser beam is not always necessary in all countries overseas, and a demand for a relatively inexpensive single crystal production apparatus has been increased.

Further, not only overseas but also in Japan, there is also a case that the single crystal production apparatus is required for not a mass production of the single crystal, but a small production such as a research for a physical property of the single crystal and a prototype of a single crystal product. There is a high hurdle for purchasing an expensive single crystal production apparatus for the small production, and due to such a high hurdle, there is an aspect that the research for the physical property of the single crystal and development of the single crystal new product are delayed.

Therefore, there is a necessity for solving the problem 2, utilizing the relatively inexpensive single crystal production apparatus using the infrared lamp and not using the crucible.

As the problem 2, it is significantly difficult to immediately improve the skill of a worker overseas, even if the research instituted in foreign countries overseas purchase the single crystal production apparatus using the laser beam. Therefore, a technique of eliminating the risk of damaging the seed crystal in the lower part is requested, without requiring an advanced skill.

Further, in addition to the above mentioned problems 1 and 2 focusing on a cost and an operability of the apparatus, it is found by the inventors of the present invention that conventional techniques of patent documents 2 and 3 involve the problems regarding a quality and a shape of the obtained single crystal itself.

(Problem 3) Originally, in the growth of the single crystal, a high quality crystal growth can be realized in a case of a steep temperature gradient rather than a gradual temperature gradient of a crystal growth portion. However, when the single crystal is grown using a laser beam source by the floating zone method, the temperature gradient of the solid-liquid interface (crystal growth portion) becomes steep, and therefore even if the high quality single crystal growth is attempted, a limit arises in its quality.

(Problem 4)

In addition to the problem 3, in the floating zone method by the laser beam, a light converging area becomes small in terms of the property of the laser, and a diameter of the rod-like raw material, and as a result, a diameter of the single crystal after growth are limited to a significantly small one.

The above mentioned problems 3 and 4 are urgent problems to be solved, because a quality level requested for the single crystal is remarkably improved, and a size of the single crystal requested for precision equipment becomes gradually large.

An object of the present invention is to provide a single crystal production apparatus and a single crystal production method, capable of remarkably reducing a production cost of the single crystal by using the infrared and not using the crucible and easily producing a relatively high quality single crystal without sagging of the melted raw material to the seed crystal even if the raw material is melted using the infrared.

Means for Solving the Problem

In order to solve the above mentioned problem, strenuous efforts are made by the inventors of the present invention. At this time, first, the inventors of the present invention study on the reason for introducing a laser beam in patent documents 2 and 3. The reason why the laser beam is introduced, is that spot heating can be performed to the raw material. The reason for performing the spot heating to the raw material, is to reduce a portion where sagging occurs and a portion where a partial melting occurs, by clarifying a solid-liquid interface which is a border between a melting zone and a solid portion. If the sagging is extended to the seed crystal disposed in the lower part, the seed crystal is damaged. Therefore, in order to make a steep temperature gradient of the solid-liquid interface as much as possible, a laser light source is introduced in patent documents 2 and 3.

However, after examination by the inventors of the present invention, it is found that originally in the growth of the single crystal, a high quality crystal growth is achieved when the temperature gradient of the crystal growth portion is steep, rather than gradual. Meanwhile, in patent documents 2 and 3 in which the laser beam is introduced, the temperature gradient of the solid-liquid interface becomes steep. Therefore, when the laser beam is used, even if the high quality single crystal is attempted to grow, a limit arises in its quality. However, as shown in patent documents 1 to 3, it is necessary to reduce the portion where the sagging occurs and the portion where the partial melting occurs. In order to solve the problem of not damaging the seed crystal, the inventors of the present invention grasp a circumstance in which there is no choice but introduce the laser beam.

Therefore, the inventors of the present invention focus on an arrangement of the raw material and the seed crystal in the single crystal production apparatus by a conventional floating zone method. As shown in patent documents 1 to 3, the raw material and the seed crystal are disposed mutually in a vertical direction in the single crystal production apparatus. By an inversion of this arrangement, the inventors of the present invention achieve a technical concept which is probably a blind point, such that the seed crystal is disposed at a vertically top position and the raw material is disposed at a vertically bottom position, and a risk of an extension of the sagging from the melting zone to the seed crystal is completely eliminated.

By specifically realizing the above mentioned technical concept, a limit in the conventional floating zone method can be canceled. As an example, when the risk of the extension of the sagging from the melting zone to the seed crystal can be completely eliminated, it is no matter that the melting zone is expanded or lengthened to some extent. As a result, there is no necessity for making the steep temperature gradient of the solid-liquid interface.

The inventors of the present invention focus on this point, and completely contrary to the conventional concept, it is found that by making a gradual temperature gradient between the melting zone and the solid portion in the raw material, the high quality single crystal can be relatively easily produced while using the floating zone method, as a suitable example of the present invention.

Aspects of the present invention based on the above mentioned knowledge re as follows.

According to a first aspect of the present invention, there is provided a single crystal production apparatus, which is configured to produce a single crystal by approaching a raw material gripped by a raw material grip portion, and a seed crystal gripped by a seed crystal grip portion by disposing the raw material grip portion and the seed crystal grip portion mutually in a vertical direction and approaching both of them each other, and forming a melting zone by a heating part and cooling the melting zone, wherein the heating part has an infrared generating part, and the seed crystal grip portion is disposed at a vertically top position, and the raw material grip portion is disposed at a vertically bottom position.

According to a second aspect of the present invention, there is provided the single crystal production apparatus of the first aspect, including an infrared shielding part freely surrounding at least a part of the raw material gripped by the raw material grip portion in a horizontal direction, and freely alleviating a temperature gradient of the raw material by gradually shielding an infrared emitted from the infrared generating part for irradiating the raw material, from a melted portion of the raw material toward the vertically bottom direction.

According to a third aspect of the present invention, there is provided the single crystal production apparatus of the second aspect, wherein a plurality of notches are formed on a vertically top side edge of the infrared shielding part, and the notches are formed at symmetrical positions with the raw material grip portion as a center when viewing the infrared shielding part from the vertically top direction.

According to a fourth aspect of the present invention, there is provided the single crystal production apparatus of any one of the first to third aspects, wherein the heating part includes a plurality of the infrared generating parts, and includes a plurality of spheroidal mirrors as reflecting parts having common focal points, with one of the focal points present in the vertically top direction viewed from the common focal points, and the infrared generating part is disposed at the other focal point.

According to a fifth aspect of the present invention, there is provided the single crystal production apparatus of any one of the first to fourth aspects, wherein the raw material grip portion has a shape engageable with a pellet-like raw material, and the seed crystal grip portion has a shape capable of griping a rod-like seed crystal.

According to a sixth aspect of the present invention, there is provided the single crystal production apparatus of any one of the first to fifth aspects, wherein the raw material grip portion can freely grip a raw material which is cylindrical and has a diameter of 10 mm or more, and a diameter of a produced single crystal is 1 mm or more.

According to a seventh aspect of the present invention, there is provided a single crystal production method for producing a single crystal by forming a melting zone after a raw material and a seed crystal are disposed mutually in a vertical direction and cooling the melting zone, the method including:

disposing the seed crystal at a vertically top position;
disposing the raw material at a vertically bottom position; and
melting the raw material by irradiation of an infrared.

Patent document 1 teaches a shielding object surrounding the "seed crystal" in a horizontal direction. This is provided for making a steep temperature gradient of a solid-liquid interface in the raw material, and not for melting the seed crystal.

Meanwhile, an "infrared control panel" in an "infrared shielding part" described later according to an embodiment, is the panel for surrounding at least a part of the "raw material" in the horizontal direction. Further, the infrared shielding part of the present invention is the part for alleviating the temperature gradient of the raw material from the melted portion of the raw material. Therefore, the shielding object of patent document 1 and the infrared shielding part of the present invention are completely different from each other.

Further, paragraph (0072) of patent document 3 in which heating dedicated to laser beam is used, describes as follows: the raw material may be arranged in the lower part and the seed crystal may be arranged in the upper part. However, there is no description regarding an effect of this arrangement. Originally, in patent document 3, the effect of the invention is exhibited by using the laser beam instead of the infrared lamp. On the contrary, patent document 3 teaches that the sagging occurs extending to the seed crystal when the infrared lamp is used (conventional example described in paragraph (0064) of the patent document 3). In addition, from a technical viewpoint, a size of a light converging area is significantly different between the laser source and the infrared lamp. Therefore, in the technique described in patent document 3, it is difficult to form the melting zone by changing a from the laser beam to the infrared.

Therefore, it is not conceivable for a skilled person, to apply a technique of patent document 3 to a technique of the present invention in which the infrared is used. Further, patent document 3 does not suggest that "it is possible to inhibit the generation of the problem of sagging to the seed crystal without using the laser beam, when the raw material is disposed in the lower part and the seed crystal is disposed in the upper part". Further, even in a case of a document other than patent document 3, there is no document that pays attention to the above mentioned content and embodies this content.

In patent documents 2 and 3, the problem of sagging to the seed crystal is solved by using the laser beam. No one of the documents discloses a motivation to solve the already solved problem, namely, a motivation to dispose the raw material in the lower part and dispose the seed crystal in the upper part, as described in the present invention.

Advantage of the Invention

According to the present invention, a relatively high quality single crystal can be easily produced, without causing the sagging of a melted raw material to occur to a seed crystal even if the raw material is melted using an infrared, at a significantly low production cost by using the infrared and not using a crucible.

BRIEF DESCRIPTION OF THE DRAWINGS

FIG. 3 is an explanatory view of a raw material holder according to an embodiment, wherein (a) is a schematic view when a raw material holder gripping a raw material is placed in a horizontal table, and (b) is a schematic cross-sectional view of the raw material holder gripping the raw material.

FIG. 4 is a view showing an example of an engagement of a raw material grip portion and the raw material.

DETAILED DESCRIPTION OF THE INVENTION

Embodiments of the present invention will be described hereafter in the following order.
1. Single crystal production apparatus
1-A) Outline of a single crystal production apparatus
1-B) Raw material grip portion
1-C) Seed crystal grip portion
1-D) Heating part
1-E) Infrared shielding part
2. Single crystal production method
2-A) Preparation step
2-B) Heating step
2-C) Single crystal growth step
3. Effect of this embodiment
4. Modified example, etc.

Regarding the content not described hereafter, a publicly-known configuration of a technique regarding an apparatus and a method of producing a single crystal by a floating zone method (for example, the configuration described in patent documents 1 to 3) may be suitably employed.

1. Single Crystal Production Apparatus

1-A) Outline of a Single Crystal Production Apparatus

Figure 1:
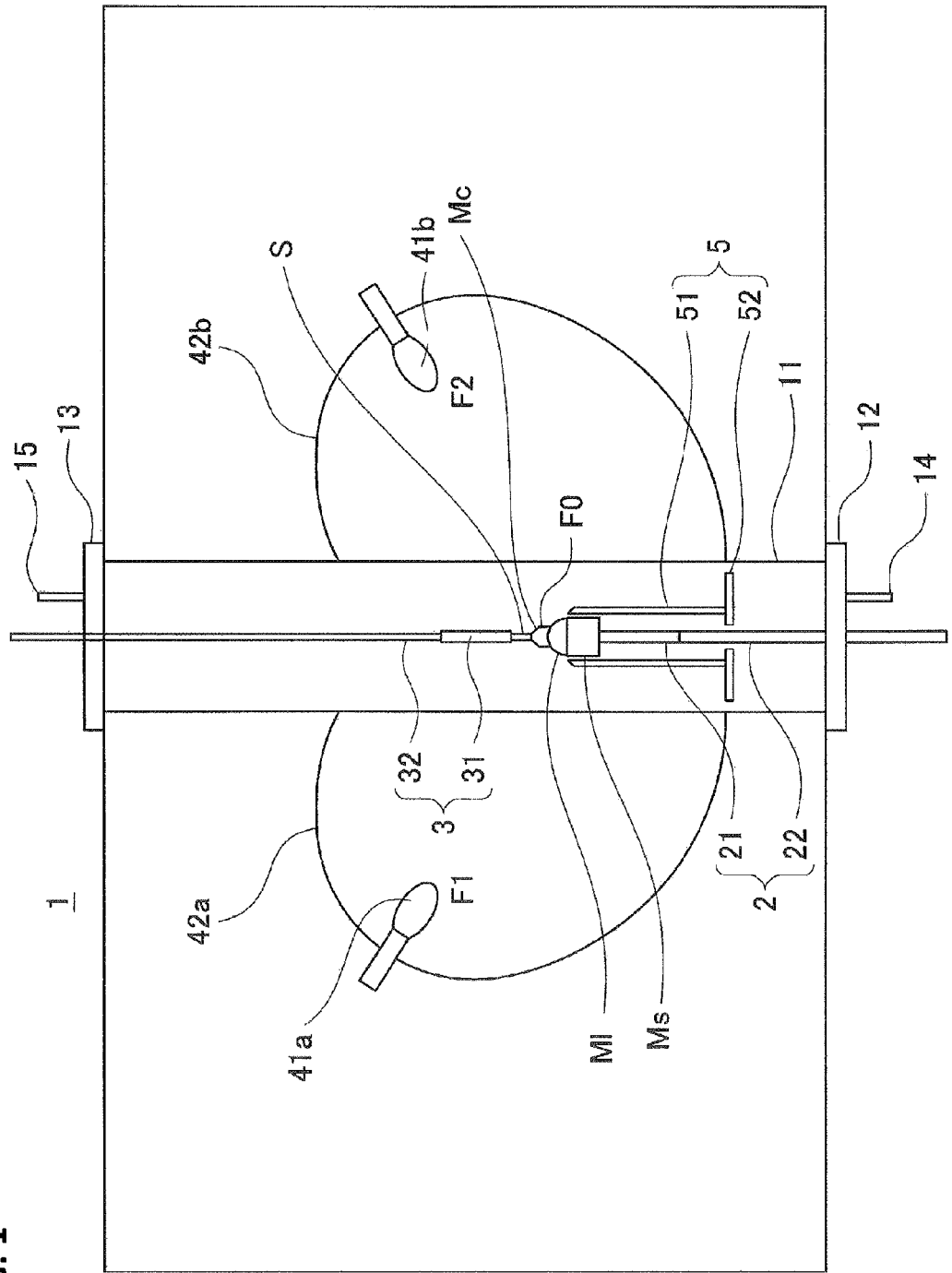
FIG. 1 is a schematic cross-sectional view of a single crystal production apparatus according to an embodiment.
Figure 2:
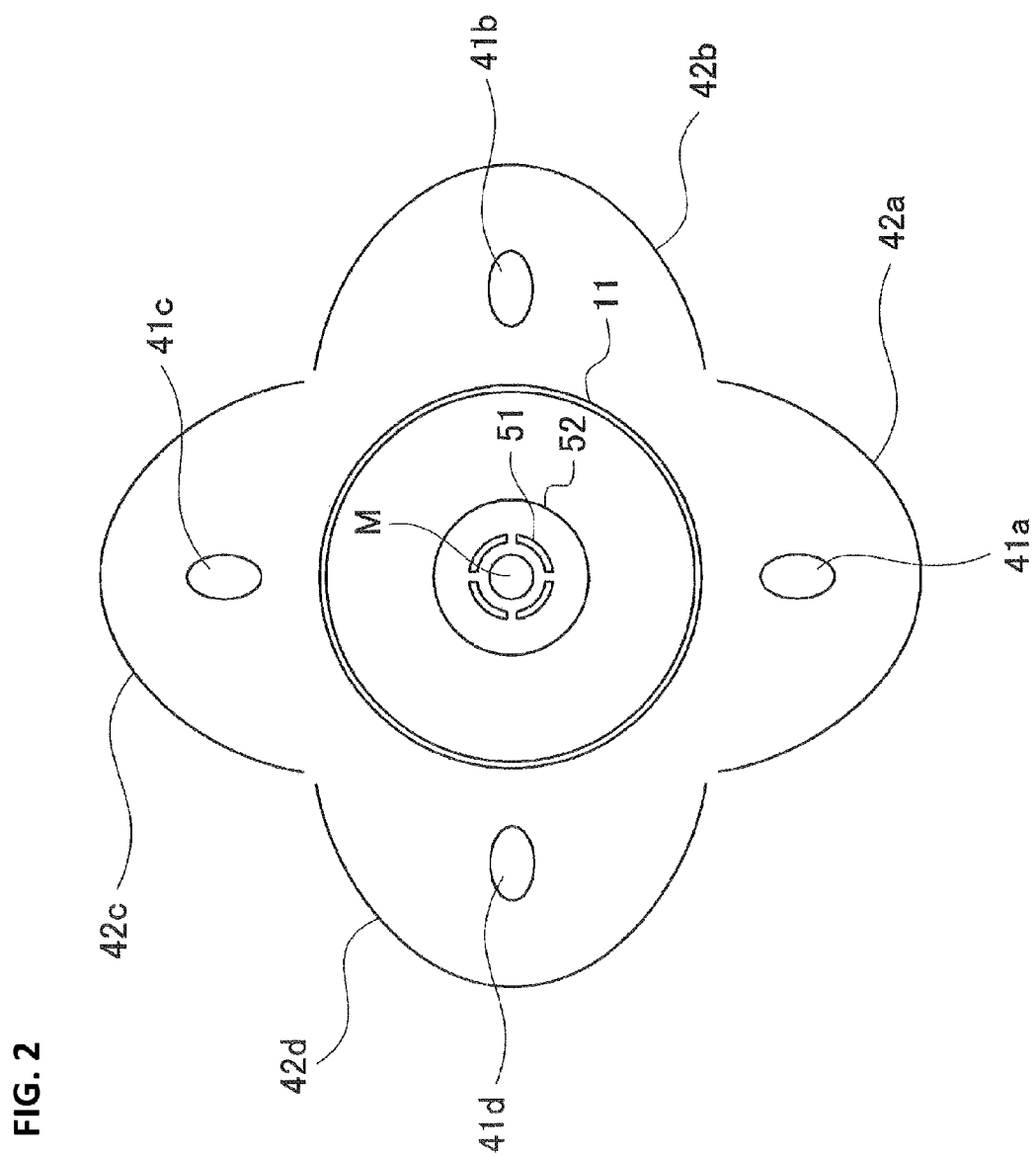
FIG. 2 is a schematic plane view of an inside of the single crystal production apparatus according to an embodiment.

Explanation is given for a basic configuration of a single crystal production apparatus 1 of this embodiment, using FIG. 1 and FIG. 2. FIG. 1 is a schematic cross-sectional view of the single crystal production apparatus 1 according to an embodiment. FIG. 2 is a schematic plane view of an inside of the single crystal production apparatus 1 according to an embodiment.

The single crystal production apparatus 1 of this embodiment has mainly the following configurations.

A raw material grip portion 2 movable in a vertical direction, and rotatable with the vertical direction as a central axis A seed crystal grip portion movable in the vertical direction and rotatable with the vertical direction as the central axis A heating part 4 for heating a raw material M gripped by the raw material grip portion 2 and melting the raw material M An infrared shielding part 5 freely alleviating a temperature gradient of the raw material M from a melted portion of the raw material M to a vertically bottom direction A crystal growth furnace for growing the single crystal, is sealed by a quartz furnace tube 11, and separates a growth atmosphere in the furnace from outside together with a lower shaft flange 12 and an upper shaft flange 13. A suitable composition atmosphere is introduced into the furnace from an atmosphere inlet port 14, and is discharged from an atmosphere outlet port 15, so that an atmosphere component and a pressure in the furnace can be suitably maintained.

There is also a configuration in which the apparatus is used as the single crystal production apparatus 1, other than the above mentioned configuration. However, a publicly-known configuration as shown in the above mentioned patent documents 1 to 3 may be suitably used as this configuration. Therefore, explanation therefore is omitted in this embodiment.

The above-listed each configuration will be mainly described hereafter.

1-B) Raw Material Grip Portion 2

A raw material grip portion 2 of this embodiment has a configuration capable of gripping the raw material M. "To grip the raw material" in this specification, means as its name suggests, such that the raw material M is firmly gripped, and is completely different from the matter that the raw material M is simply housed in the crucible. Therefore, non-use of the crucible is uniquely derived by the expression of "raw material grip portion".

A great characteristic of this embodiment is that the raw material grip portion 2 is disposed at a vertically bottom position. Thus, the risk of the extension of the sagging from melting zone M1 to seed crystal S, can be completely eliminated.

Further, a limit of a conventional floating zone method can be solved, and a certain degree of expansion of the melting zone M1 may be acceptable. As a result, there is no necessity for making a steep temperature gradient of the solid-liquid interface. Although described in detail later, completely contrary to a conventional concept, it becomes possible to suppress the generation of cracks that occurs in the raw material M, by separately employing a configuration (infrared shielding part 5) for alleviating the temperature gradient between the melting zone M1 and a solid portion Ms in the raw material M. As a result, it becomes possible to leave a room for relatively easily producing a high quality single crystal while using the floating zone method. This is a completely a contrary configuration to the conventional floating zone method, because the raw material grip portion 2 is disposed at a vertically bottom position, and the seed crystal grip portion 3 is disposed at a vertically top position.

Further, in this embodiment, it is characteristic that the pellet-like raw material M is used as the raw material M. Therefore, it is also characteristic that the raw material grip portion 2 has a shape engageable with the pellet-like raw material M. More specifically, the raw material grip portion 2 of this embodiment is constituted of a "raw material holder 21" for gripping the raw material M, and a "lower shaft 22" which is a rotation axis and a vertical movement axis of the raw material holder 21.

An example of employing the above mentioned configuration will be described hereafter, using FIG. 3. FIG. 3 is an explanatory view of the raw material holder 21 according to an embodiment, wherein (a) is a schematic view when a raw material holder 21 gripping a raw material is placed in a horizontal table, and (b) is a schematic cross-sectional view of the raw material holder 21 gripping the raw material.

As shown in FIG. 3, the pellet-like raw material M is placed on a raw material base 211 of the raw material holder 21, and the pellet-like raw material M is sandwiched by a ceramic cramp 213 provided to a holder 212 to sandwich the pellet-like raw material M, to thereby fix the raw material M. Further, the cramp 213 is fastened by a screw 214 together with the holder 212. Then, the pellet-like raw material M is sandwiched by the cramp 213, to thereby fix the raw material M. Note that a suspension may be made by a metal having a high melting point and a corrosion resistance such as platinum and an alloy containing platinum, other than the fastening by the screw 214.

At this time, the raw material M and the holder 212 may be easily fixed on the same axis by sandwiching a washer 215 made of a refractory material between the raw material M and the holder 212.

Incidentally, the holder 212 is fixed to the lower shaft 22 via a fastener 216.

Conventionally, a rod-shaped raw material M is used as the raw material M. However, manufacture of the rod-like raw material M itself originally requires a considerable skill.

Then, the rod-like raw material M itself is expensive naturally, and in this case, even if the single crystal production apparatus 1 itself is inexpensive, a user of the single crystal production apparatus 1 has no choice but purchase the expensive rod-like raw material M, and an effect of making the single crystal production apparatus 1 inexpensive is reduced.

Therefore, in this embodiment, the raw material grip portion 2 (specifically the raw material holder 21, and more specifically a raw material base 211) has a shape engageable with the pellet-like raw material M. The "pellet-like" called here, refers to substantially a cylindrical mass, unlike a rod-like long shape. As a specific numerical value, the pellet-like raw material M is preferably a cylindrical raw material M having a diameter of 10 mm to 50 mm and a height of 10 mm to 100 mm. Also, the raw material grip portion 2 preferably has a shape capable of freely gripping the above shaped raw material M. It is a matter of course that the present invention is not limited to the diameter or height, and the shape of the raw material is not required to be a pellet shape, and it is acceptable to use a rod-like raw material (for example, having a diameter of 20 mm and a length of 200 mm) formed for the floating zone method.

Further, the raw material holder 21 of the single crystal production apparatus 1 of the present invention, is not limited to the shape engageable with the pellet-like raw material M, and may have the shape capable of freely gripping the rod-like raw material M as conventional. However, as described above, the raw material holder 21 of the present invention is completely different from the crucible.

Further, the "engagement" called here refers to a relation of fixing the raw material M by a combination of the shape of the raw material holder 21 and the shape of the raw material M.

A specific shape of the raw material holder 21 is not limited to the above mentioned configuration, and an arbitrary shape may be acceptable if it can grip the raw material M. For example, when the rod-like raw material M is gripped as conventional, the conventional raw material holder 21 may be used. Meanwhile, when the pellet-like raw material M is gripped, a configuration engageable with the pellet-like raw material M (for example, a cap-like grip portion) may be used as the raw material holder 21. In the conventional technique, when the rod-like raw material M is supported by the cap-like raw material holder 21, it becomes difficult to stably dispose the rod-like raw material M because the raw material M has a long shape. Owing to the pellet-like raw material M, it becomes possible to employ the cap-like raw material holder 21.

Further, as a specific shape of the raw material holder 21, the following shape can be given. FIG. 4 is a view showing an example of the engagement of the raw material grip portion 2 and the raw material M.

In FIG. 4(a), a screw is provided in a lower part of the pellet-like raw material M. In this screw, a lower part of the pellet-like raw material M may be processed into a screw shape, or another screw member may be fixed to the lower part of the raw material M. In this case, the "raw material" refers to the "raw material having such another screw member fixed thereto". Then, a nut is provided in an upper part (raw material base 211) of the raw material holder 21.

By employing the above mentioned configuration, the pellet-like raw material M is screwed into the raw material holder 21, to thereby make it possible to easily fix the raw material M to the raw material base 211. This is also a significantly difficult fixing method for the rod-like raw material M, which is the fixing method that can be enabled by making the pellet-like raw material M.

In FIG. 4(b), contrary to FIG. 4(a), the nut is provided in the lower part of the pellet-like raw material M, and the screw is provided in the raw material base 211. The screw may be formed by processing the raw material base 211 into the screw shape, or another screw member may be fixed to the raw material base 211.

Note that the above mentioned example is an example of a case in which the raw material holder 21 employs the configuration engageable with the pellet-like raw material M. Meanwhile, even if the raw material holder 21 and the raw material M are not engaged with each other, the raw material M may be fixed, for example by fixing the raw material base 211 and the raw material M with a refractory cement.

Further, a publicly-known material may be used as the material of the raw material holder 21. For example, the refractory material may be used. As the refractory material, the material made of alumina, zirconia, and silica, and further a mixture of them may be used.

Then, the raw material grip portion 2 has a configuration movable in the vertical direction and rotatable around the vertical direction as a central axis. In this embodiment, the lower shaft 22 is the central axis. A drive source for driving the raw material grip portion 2 is not shown.

1-C) Seed Crystal Grip Portion 3

A seed crystal grip portion 3 of this embodiment has a configuration capable of gripping a seed crystal S, and for example has a seed crystal holder 31 and an upper shaft 32. Note that the seed crystal grip portion 3 may have a publicly-known configuration. However, one of the great characteristics of this embodiment is that the seed crystal grip portion 3 is disposed at a vertically top position, corresponding to the arrangement of the raw material grip portion 2 which is disposed at a vertically bottom position. This arrangement makes it possible to completely eliminate the risk of the extension of sagging from the melting zone M1 to the seed crystal S.

The shape of the seed crystal S of this embodiment may be an arbitrary shape, if it makes it possible to produce the high quality single crystal finally. In this embodiment, similarly to conventional, the case of using the rod-like seed crystal S will be described. Further, it is a matter of course that the single crystal is preferable as the crystal structure of the seed crystal S, but when the single crystal is not available, it is acceptable to use ceramics having the same quality as the quality of the raw material or a single crystal whose crystal structurer is similar to a target single crystal.

The seed crystal grip portion 3 also has the configuration movable in the vertical direction and rotatable around the vertical direction as the central axis. The drive source for driving the seed crystal grip portion 3 is not shown.

This embodiment shows the following example: both of the raw material grip portion 2 and the seed crystal grip portion 3 are movable in the vertical direction and rotatable around the vertical direction as the central axis. Meanwhile, it is also acceptable that either one of the raw material grip portion 2 or the seed crystal grip portion 3 has the configuration movable in the vertical direction. In order to produce the single crystal by the floating zone method, it is necessary to make the raw material M and the seed crystal S in contact with each other and thereafter separate them from each other. Therefore, it is sufficient that one of them is movable in the vertical direction. However, in order to produce the high quality single crystal without defects, more preferably both of the raw material grip portion 2 and the seed crystal grip portion 3 are movable in the vertical direction. Further, both of them are not required to be rotatable around the vertical direction as the central axis, it is preferable that both of them have a rotatable configuration to produce the high quality single crystal without defects.

Regarding the other configuration, a similar configuration as the configuration of the raw material grip portion 2 may be suitably employed.

1-D) Heating Part 4

A heating part 4 of this embodiment has infrared generating parts 41a to d, and has a function of heating the raw material M gripped by the raw material grip portion 2 and melting the raw material M. Further, the heating part 4 of this embodiment also has reflecting parts 42a to d other than the infrared generating part 41, to thereby improve an irradiation efficiency by reflecting the infrared to the raw material M.

As shown in FIG. 1, first, spheroidal mirrors 42a and 42b, being reflecting parts 42, have a common focal point F0. In addition, the spheroidal mirror 42a has a focal point F1 as the other focal point, in the upper part of the focal point F0. Similarly, the spheroidal mirror 42b has a focal point F2 in the upper part of the focal point F0. Here, explanation is given for 41a and 41b of the infrared generating parts 41a to d, and 42a and 42b of the spheroidal mirrors 42a to d, as examples, which are called infrared generating part 41 and spheroidal mirror 42 collectively hereafter.

The infrared generating parts 41a and 41b are disposed at focal points F1 and F2 respectively. The infrared heating and generating part itself may have a publicly-known configuration. For example, a halogen lamp or a xenon arc lamp or a combination thereof may be acceptable. The common focal point F0 of the spheroidal mirror 42 is a heated portion, and the melting zone M1 formed by making the melted raw material M and the seed crystal S in contact with each other, is disposed in the heated portion, and such a configuration is employed. Then, the single crystal is grown by cooling the melting zone M1 by separating the raw material grip portion 2 and the seed crystal grip portion 3 from each other so that the melting zone M1 is deviated from the heated portion.

Also, one of the characteristics of this embodiment is that the infrared generating part 41 is disposed at the vertically top position, which is in more upper part than the melting zone M1. In other word, by disposing the infrared generating part 41 and the spheroidal mirror 42 so that each infrared generating part 41 is disposed in more upper part than the common focal point F0 of each spheroidal mirror 42, the following effect is exhibited.

First, the melting zone M1 is formed by heating using the infrared, by making an upper edge of the raw material M in contact with the seed crystal S. At this time, the seed crystal S is also melted. Thereafter, this is cooled by deviating the melting zone M1 from the light converging area (F0) of the infrared, while expanding a distance between the raw material M and the seed crystal S. However, in terms of the relation of disposing the raw material grip portion 2 in a lower part, the raw material grip portion 2 and the seed crystal grip portion 3 are relatively moved so that a growth portion from the melting zone M1 to the single crystal (called a "growth portion Mc" hereafter, or the single crystal is simply called Mc in some cases) is moved upward.

When the infrared generating part 41 is disposed at a horizontal position of the melting zone M1, the grown portion Mc is easily deviated from an area where the infrared is converged, due to the upward movement of the growth portion Mc, and the growth portion Mc is cooled at once. In this case, the temperature gradient becomes steep in the growth of the single crystal.

However, as shown in this embodiment, when the infrared generating part 41 is disposed in more upper part than the melting zone M1, the infrared generating part 41 still exists in the upper part even if the growth portion Mc is moved upward, and therefore heating of the growth portion Mc is continued to some extent. Therefore, the temperature gradient becomes gradual in the growth of the single crystal.

An effectiveness of making a gradual temperature gradient will be described hereafter.

Originally, in order to produce the high quality single crystal, it is necessary to suitably control the melting zone M1 of the raw material M, if ignoring the difficulty of production. Further, the steep temperature gradient in the raw material M is originally not preferable, because a trouble such as causing a distortion of a crystal lattice occurs.

However, conventionally, as described in patent documents 1 to 3, sagging of the melting zone M1 occurs extending to the seed crystal S, due to expansion or lengthening of the melting zone M1 unless the steep temperature gradient is made. Therefore, in consideration of the difficulty of production, there is no choice but make the steep temperature gradient in the raw material M. Under such a circumstance, the laser beam is employed in patent documents 2 and 3.

Meanwhile, there is no necessity for providing the steep temperature gradient if the problem of the sagging of the melting zone M1 is solved, as described in the present invention. Then, focusing on the quality of the single crystal, it becomes possible to make a gradual temperature gradient in the raw material M and suitably maintain the melting zone M1 in the raw material M. A specific configuration of making a gradual temperature gradient is the above mentioned arrangement of the infrared generating part 41. Thus, it becomes possible to continuously heat the growth portion Mc to some extent, in other words, apply mild cooling to the growth portion Mc. As a result, it becomes possible to make a gradual temperature gradient in the raw material M, and the melting zone M1 in the raw material M can be suitably controlled. Consequently, the high quality single crystal can be produced.

There is a description regarding an irradiation of the laser beams which performs obliquely toward the raw material M, in paragraph (0069) of patent document 3. However, the irradiation of the laser beam is described as a modified example of making the steep temperature gradient in the raw material M, which is a completely contrary to the content such that "mild cooling is applied to the raw material M to make the gradual temperature gradient" as describe in this embodiment. Therefore, it is not easily achieved that "the infrared generating part 41 is disposed at a vertically top position, in more upper part than the melting zone M1", from the content of patent document 3 specializing in the laser beam.

Incidentally, as a specific arrangement of the infrared generating part 41, the infrared generating part 41 is preferably disposed at an upper position by 15 degrees to 45 degrees, viewed from the horizontal direction of the melting zone M1 of the raw material M.

At the position of 15 degrees or more, heating of the melting zone M1 can be continued to some extent when the single crystal is grown while the melting zone M1 is moved upward, and the temperature gradient becomes gradual. As a result, generation of a crystal interface and a low-angle grain boundary is suppressed, and crystallinity is improved.

At the position of 45 degrees or less, the infrared can be suitably converged to the melting zone M1, and the melting zone M1 can be suitably formed and controlled.

Further preferably, the infrared generating part 41 is disposed at a position upward by 30 degrees to 45 degrees. This is because at the position of 30 degrees or more, the generation of the crystal interface and the low-angle grain boundary is completely suppressed.

As shown in FIG. 2 which is a schematic plan view of the inside of the single crystal production apparatus 1 of this embodiment, four spheroidal mirrors 42*a* to 42*d* are provided as the reflecting parts 42. Then, the infrared generating part 41 corresponding to each spheroidal mirror 42 is disposed at the vertically top position, in more upper part than the melting zone M1, and at the focal position of one (upper one) of the spheroidal mirrors 42. The other (lower) focal position is the melting zone M1. Although four spheroidal mirrors 42 and infrared generating parts 41 are provided, it is a matter of course that the other number of spheroidal mirrors 42 and infrared generating parts 41 may be provided. Also, in addition to the infrared generating part 41, the laser beam generating part may be provided in the lower part of the spheroidal mirror 42. Irradiation of the laser beam may be performed toward the raw material M in addition to the infrared, using the laser beam generating part. By using a target scope (not shown) and performing an intensive irradiation of the laser beam toward a solid phase deposited on the melting zone M1, the raw material M is partially heated, and the solid phase can be melted into the melting zone M1 again. Thus, a stable growth of the single crystal is enabled. Therefore, similarly to the spheroidal mirror 42, the laser beam generating part may be disposed with a tilt angle directed to the melting zone M1. Also, the laser beam generating part may have a configuration capable of arbitrarily controlling the tilt angle up and down, and right and left. However, since an apparatus including the laser beam generating part is expensive, the single crystal production apparatus 1 is preferably configured to include the infrared generating part 41 only basically and include the laser beam generating part as an option.

1-E) Infrared Shielding Part 5

In this embodiment, the infrared shielding part 5 is provided as a further suitable configuration. The infrared shielding part 5 of this embodiment has a configuration of freely surrounding at least a part of the raw material M gripped by the raw material grip portion 2 in the horizontal direction, and having a notch 53 on an upper edge of the cylindrical infrared control panel 51 that shields the infrared emitted from the infrared generating part 41 and used for irradiating the raw material M. Thus, an exposed area of the raw material M is gradually reduced, from the melted portion of the raw material M to the vertically top position. In other words, irradiation of the infrared toward the raw material M is gradually shielded. Thus, the temperature gradient of the raw material M becomes gradual from the melted portion of the raw material M to the vertical top position.

As is clarified in FIG. 1, the infrared control panel 51 is disposed around the solid portion Ms of the raw material M in the lower part of the melting zone M1. The infrared control panel 51 is fixed on a floor 52, and is connected to a drive mechanism (not shown) in the vertical direction. Description of a shaft or a member for vertically driving the floor 52 is omitted.

Figure 5:
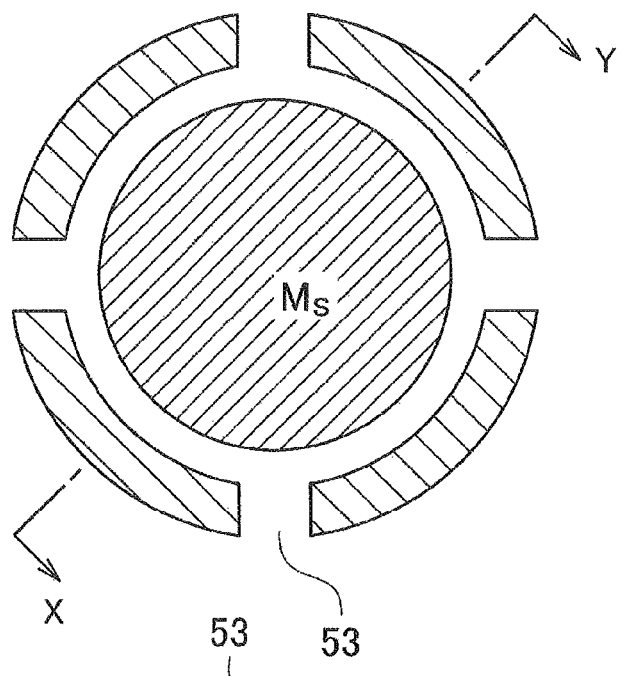
FIG. 5 is a schematic view of an infrared shielding part according to an embodiment, wherein (a) is a plane view and (b) is a side view.
Figure 5:
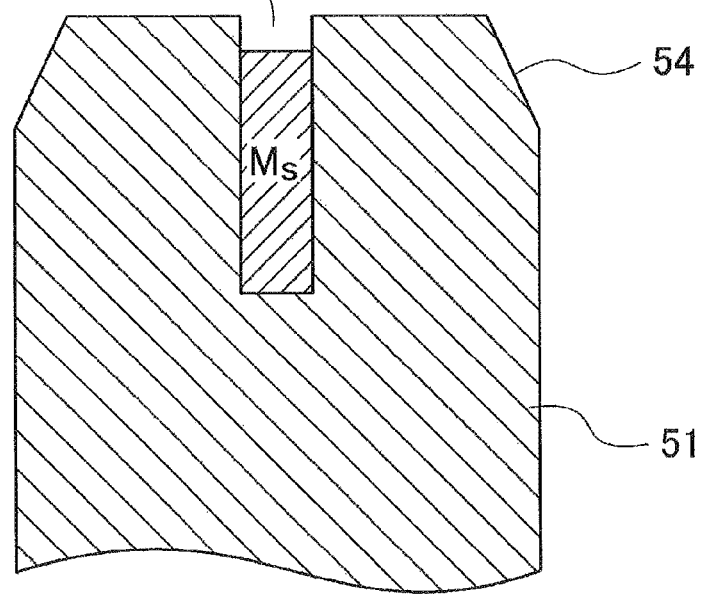
Figure 6:
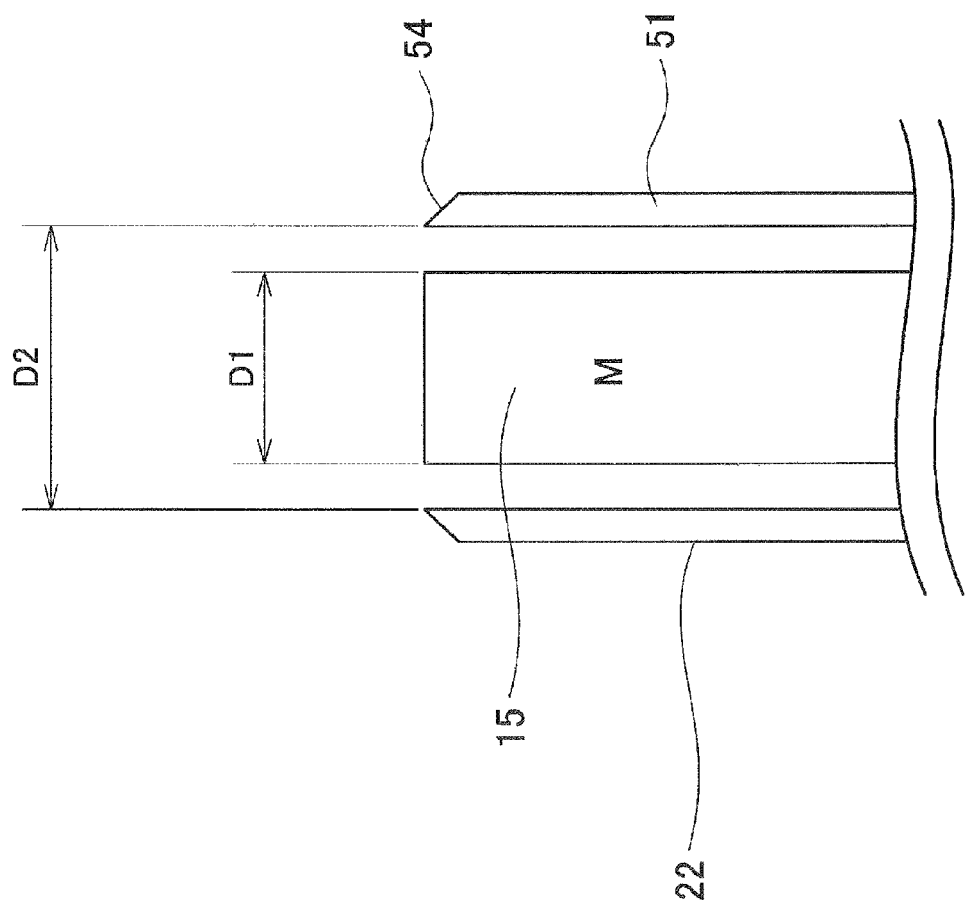
FIG. 6 is a schematic cross-sectional view of the infrared shielding part taken along the line X-Y of FIG. 5.

The infrared shielding part 5 will be described using FIG. 5 and FIG. 6. FIG. 5 is a schematic view of the infrared shielding part 5 of this embodiment, wherein (a) is a plan view and (b) is a side view. FIG. 6 is a schematic cross-sectional view of the infrared shielding part 5 taken along the line X-Y of FIG. 5.

As shown in FIG. 5, a plurality of notches 53 are formed on a vertically top side edge portion of the infrared control panel 51. Then, the notches 53 are formed at a symmetrical position with the raw material grip portion 2 as a center, when viewing the infrared control panel 51 from the vertically top direction. More specifically, the notches 53 are provided at four places at equal intervals on the upper edge of the infrared control panel 51 having a donut shape in plan view, for forming a crystal growth environment in a rotationally symmetrical shape as much as possible.

By providing the plurality of notches 53 on the infrared control panel 51, the exposed area of the raw material M can be gradually reduced. As a result, the temperature gradient of the raw material M can be gradual from the melted portion of the raw material M to the lower part.

Once again, the raw material M is disposed in the upper part and the seed crystal S is disposed in the lower part in the conventional floating zone method. Therefore, improvement must be continued while being cautious about the sagging from the melting zone M1 extending to the seed crystal S. However, contrary to such a concept, a technical concept of the present invention is that the seed crystal S is disposed in the upper part and the raw material M is disposed in the lower part. Without the technical concept of the present invention, it is difficult to achieve the concept of making the gradual temperature gradient of the raw material M.

The effect of making the gradual temperature gradient of the raw material M from the melting portion of the raw material M toward the lower part by the infrared shielding part 5, is slightly different form the effect brought about by 1-D) Heating part 4 described above. Explanation will be given hereafter.

The effect brought about by 1-D) Heating part 4 is the effect regarding the vicinity (growth portion Mc) of the portion in contact with the upper seed crystal S in the melting zone M1 of the pellet-like raw material M. Namely, by making the gradual temperature gradient in this vicinity, the effect of improving the quality of the single crystal that grows from the growth portion Mc can be exhibited.

On the other hand, the effect brought about by the 1-E) Infrared shielding part 5 is mainly to eliminate the defects when producing the single crystal by making the gradual temperature gradient of the raw material M from the melting portion of the raw material M toward the lower part, rather than the quality of the single crystal.

If the temperature gradient of the raw material M is remarkably large from the melted portion of the raw material M toward the lower part, it can be considered that a temperature difference is excessively generated between the melting zone M1 and the solid portion Ms, and the solid phase is precipitated on the melting zone M1. In further severe case, there is a risk of causing cracks in the raw material M of the solid portion Ms. Therefore, the notch 53 is preferably provided on the infrared control panel 51 rather than simply providing the infrared control panel 51, so that the exposed area of the raw material M is gradually reduced. Further, in the case of the infrared control panel 51 without notch 53, heat is likely to be confined between the raw material M and the infrared control panel 51 even if the infrared can be shielded from the raw material M, and there is a risk of generating an excessive temperature difference between a raw material M side inner wall and the opposite side outer wall of the infrared control panel 51. As a result, there is a possibility that a breakage occurs not only in the solid portion Ms of the raw material M, but also in the infrared control panel 51 which is a member of the single crystal production apparatus 1.

Therefore, by providing the notch 53 on the infrared control panel 51, the heat between the raw material M and the infrared control panel 51 can escape. Then, the temperature difference between the inner wall and the outer wall of the infrared control panel 51 can be reduced. Of course, the temperature difference between the melting zone M1 and the solid portion Ms can also be reduced.

Further, by providing the notch 53 on the infrared control panel 51, it becomes possible to respond to a circumstance that assumes the above mentioned problem 1 and problem 2. The problem of the present invention describes as follows: in recent years, the single crystal production apparatus 1 has been spread mainly in research institutes of not only in Japan but also in foreign countries including Asia. In a study of the production of single crystals, it is significantly important to observe the melting of the raw material M and a growth state of the single crystal after brought into contact with the seed crystal S, visually or by a camera. According to this embodiment, it becomes easy to observe the melting of the raw material M and the growth state of the single crystal, form the notch 53 provided on the infrared control panel 51.

As a result, by providing the notch 53 on the infrared control panel 51, it becomes possible to suppress not only an appearance of the solid phase and the cracks of the raw material M, but also the generation of the breakage of the infrared shielding part 5 which is a member of the single crystal production apparatus 1. It also becomes possible to observe the melting of the raw material M and the growth state of the single crystal visually or by a camera.

A width (horizontal length) of the notch 53 may be an arbitrary value if the effect of the present invention can be exhibited. However, it is preferable to provide the width of 2 mm to 3 mm for example, so that a positional relation between the raw material M and the melting zone M1 and the shape of them can be freely observed.

Further, a height of the notch 53 (vertical length) may also be an arbitrary value, if the effect of the present invention can be exhibited. However, when the height of the notch 53 is excessively small, the temperature gradient is generated, which is substantially similar to a case when the notch 53 does not exist. Therefore, the height of the notch 53 is preferably 1 mm to 20 mm, and more preferably 5 mm to 10 mm.

Further, the number of the notches 53 may be an arbitrary number, if the effect of the present invention can be exhibited. Also, not the notch 53, but the infrared shielding part 5 having a plurality of holes formed thereon as shown in <4. Modified example, etc.> may be employed. However, in the raw material M, in order to make a uniform temperature gradient of the raw material M, a plurality of holes are preferably formed on an upper edge of the infrared control panel 51 in plane view at equal intervals.

Further, a taper 54 or a rounded part may be formed on an outside of the upper edge of the infrared control panel 51 (when the side opposite to the raw material M is defined as an inside, the side opposite thereto is defined as the outside). When there is no taper 54 or rounded part, a heating light from the lower part of the spheroidal mirror 42 is shielded by the infrared control panel 51. However, by forming the taper 54 or the rounded part, loss of the infrared reflected by the spheroidal mirror 42 can be reduced, and the infrared emitted from the infrared generating part 41 can be efficiently used.

Further, the infrared shielding part 5 has a configuration in which it can move in the vertical direction, relatively to the raw material grip portion 2.

The pellet-like raw material M gripped by the raw material grip portion 2, is melted by the heating part 4, to thereby form the melting zone M1. Then, by moving the raw material grip portion 2 and the seed crystal grip portion 3 so that a distance between them becomes large, the single crystal Mc grows from the melting zone M1. Since the single crystal Mc grows continuously, the solid portion Ms of the raw material M is gradually reduced. Then, the vertical height of the raw material M is also gradually reduced. If the infrared shielding part 5 cannot relatively move to the raw material grip portion 2, the raw material M is completely concealed by the infrared control panel 51 with advancement of the growth of the single crystal M, and the raw material M cannot be melted any more. Therefore, the infrared shielding part 5 has the configuration in which it can move relatively to the raw material grip portion 2.

If viewed from another aspect, by having this configuration, it becomes possible to adjust an irradiation amount of the infrared to the material M. There is a possibility that a suitable size of the melting zone M1 is changed, depending on a difference of growth conditions of the single crystal Mc such as the kind or the size of the raw material M. However, by employing the infrared shielding part 5 that can be moved relatively as described above, the irradiation amount of the infrared to the raw material M can be suitably adjusted, and the suitable size of heat melting zone M1 can be realized.

A positional relation between the raw material grip portion 2 and the infrared shielding part 5 will be described next, using FIG. 6. FIG. 6 is a schematic cross-sectional view of the infrared shielding part 5 taken along the line X-Y of FIG. 5.

As shown in FIG. 6, an interval [(D2−D1)/2] is provided between the pellet-like raw material M and the infrared control panel 51.

If this interval is excessively large, the infrared to be shielded enters from this interval, and a side face of the solid portion Ms which is not supposed to be melted originally, is heated and melted. Then, it becomes difficult to maintain the melting zone M1.

Meanwhile, if the interval is excessively small, it becomes difficult to perform a setting work of the raw material M and the infrared control panel 51. Further, it is also conceivable that the melting zone M1 during crystal growth, is interfered with the infrared control panel 51.

In view of the above mentioned circumstance, a preferable interval [(D2−D1)/2] is 1 mm to 20 mm, preferably 2 mm to 16 mm, and more preferably 2 mm to 10 mm. However, the present invention is not limited thereto.

In the present invention, the infrared shielding part 5 is not necessarily required. Even when not providing the infrared shielding part 5, there is no difference in the effect brought about by disposing the seed crystal grip portion 3 in the upper part, and disposing the raw material grip portion 2 in the lower part.

However, by disposing the seed crystal grip portion 3 in the upper part, and disposing the raw material grip portion 2 in the lower part, the limit in the conventional floating zone method can be canceled. Since the limit is canceled, it is significantly preferable to employ the configuration in which the temperature gradient is made to be gradual. That is, it is significantly preferable that the infrared shielding part 5 of this embodiment, is provided in the single crystal production apparatus 1 of this embodiment.

This is also applied to a case when the infrared generating part 41 is disposed at more vertically top position than the melting zone M1.

It is a matter of course that the other confirmation may be suitably employed according to the application of the single crystal production apparatus 1.

2. Single Crystal Production Method

Figure 7:
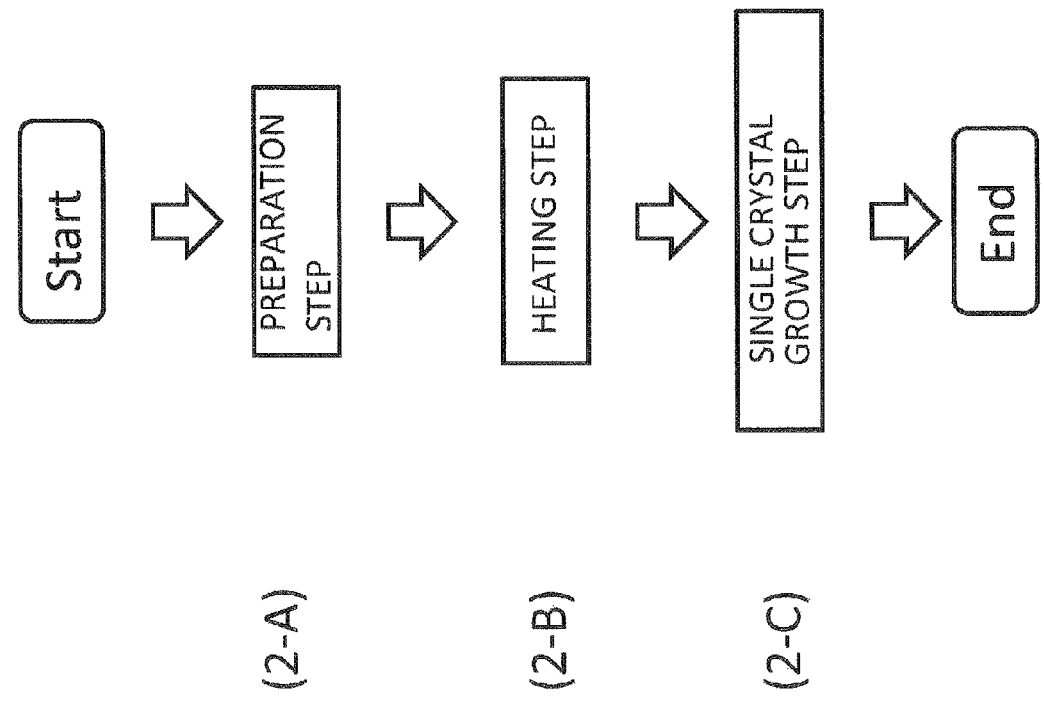
FIG. 7 is a flowchart showing a procedure of a single crystal production method according to an embodiment.

An operation procedure of the single crystal production apparatus 1 of this embodiment will be described next, using FIG. 7. FIG. 7 is a flowchart showing a procedure of the single crystal production method of this embodiment. The content of the following step is sometimes overlapped with the content described in <1. Single crystal production apparatus 1>. Therefore, regarding a content not described hereafter, the content is the same as described in <1. Single crystal production apparatus 1>. Further, regarding the content not described hereafter, the techniques of patent documents 1 to 3 or publicly-known techniques may be suitably employed.

Further, in the following steps, in order to make the invention easy to be understood, an embodiment of each part of each unit of the single crystal production apparatus 1 will be described. Of course, the present invention is not limited to the embodiment of each part or each unit.

2-A) Preparation Step

First, each configuration required for the single crystal production apparatus 1 is disposed as described in <1. Single crystal production apparatus 1>. Further, the pellet-like raw material M is engaged with the raw material grip portion 2 provided in the lower part, so that the rod-like seed crystal S is gripped by the seed crystal grip portion 3 provided in the upper part. That is, the raw material M and the seed crystal S are disposed so as to be opposed to each other. Then, by making the raw material grip portion 2 and the seed crystal grip portion 3 approached to each other, the raw material M gripped by the raw material grip portion 2 and the seed crystal S gripped by the seed crystal grip portion 3, are approached to each other.

2-B) Heating Step

Irradiation of the infrared generated from the infrared generating part 41, is performed directly to the raw material M and indirectly to the raw material M after being reflected by the spheroidal mirror 42. Then, the upper edge of the pellet-like raw material M, which is the portion opposed to the seed crystal S, is melted by a direct light and the heating light converged by the spheroidal mirror 42. By making the seed crystal S, which is slightly melted, in contact with the melted portion, the melting zone M1 is formed.

2-C) Single Crystal Growth Step

In this step, the single crystal is grown from the melting zone M1. More specifically, the upper shaft 32 in the seed crystal grip portion 3, is elevated. Thus, the melting zone M1 is raised upward. However, the upper part (growth portion Mc) of the melting zone M1 is gradually deviated from the focal point of irradiation of the infrared, and the temperature of the growth portion Mc is gradually lowered.

Meanwhile, since the single crystal Mc is grown one after another from the melting zone M1, a new melting zone M1 is required to be formed. Therefore, the solid portion Ms in the lower part of the melting zone M1 in the pellet-like raw material M is required to be moved one after another to the light converging area of the infrared. Therefore, the lower shaft 22 in the raw material grip portion 2 is also elevated. However, an elevation speed is set to be smaller than the elevation speed of the lower shaft 32 of the seed crystal grip portion 3, in terms of a point that the single crystal must be grown one after another from the melting zone M1. Thus, the distance between the raw material grip portion 2 (namely, the solid portion Ms of the raw material M) in the lower part, and the seed crystal grip portion 3 (namely, seed crystal S), becomes gradually large. Such a distance is called a "separation" in this specification.

The infrared control panel 51 having the notch 53 is also moved upward, in association with the movement of the pellet-like raw material M upward. However, the elevation speed of the infrared shielding part 5 is not required to coincide with the elevation speed of the lower shaft 22 of the raw material grip portion 2. The elevation speed of the infrared shielding part 5 may be adjusted while adjusting so that the melting zone M1 is not excessively expanded and not excessively long.

With such an adjustment, the vertical movement and the speed of the seed crystal grip portion 3, the raw material grip portion 2, and the infrared shielding part 5 may be controlled by a control part (not shown), which is the content regarding <1. Single crystal production apparatus 1>. The control at this time may be performed as follows: an operator of the single crystal production apparatus 1 gives an instruction to the control part by an operating part (not shown) while observing a state of the melting zone M1 from the notch 53 of the infrared control panel 51, and adjusts the vertical movement and the speed of the seed crystal grip portion 3, the raw material grip portion 2, and the infrared shielding part 5.

By performing the above steps, the growth portion Mc in the melting zone M1 is cooled, and the single crystal having a large diameter of 1 mm or more (preferably 50 mm or more) for example, can be formed. Then, when the single crystal of a prescribed amount is formed, the production of the single crystal is ended while performing an appropriate necessary work.

Figure 8:
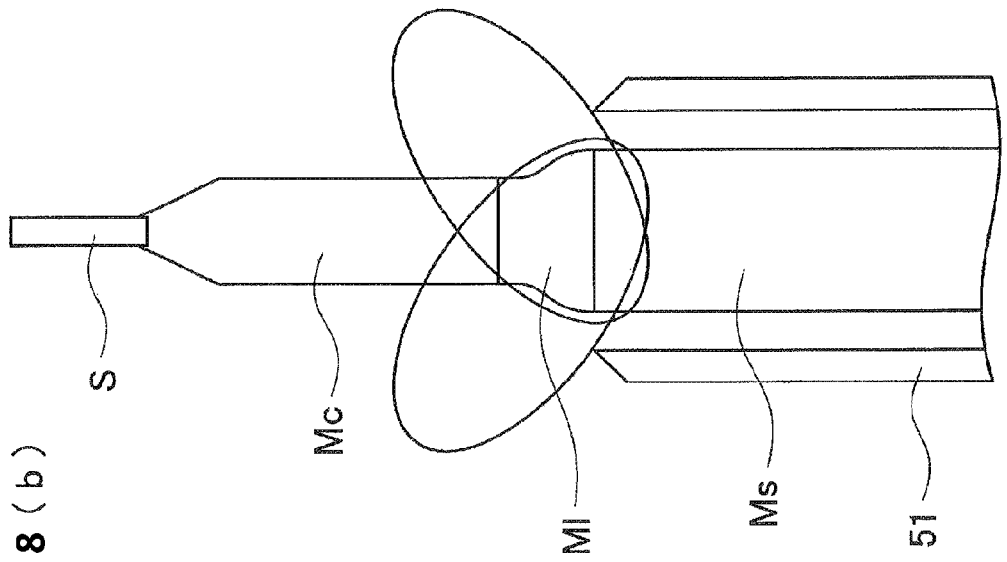
FIG. 8 is a schematic cross-sectional view showing a state of the single crystal growing step in the single crystal production method according to an embodiment, wherein (a) is a schematic cross-sectional view when an infrared generating part is disposed at a horizontal position of a melting zone, and (b) is a schematic cross-sectional view when the infrared generating part is disposed in more upper part than the melting zone.
Figure 8:
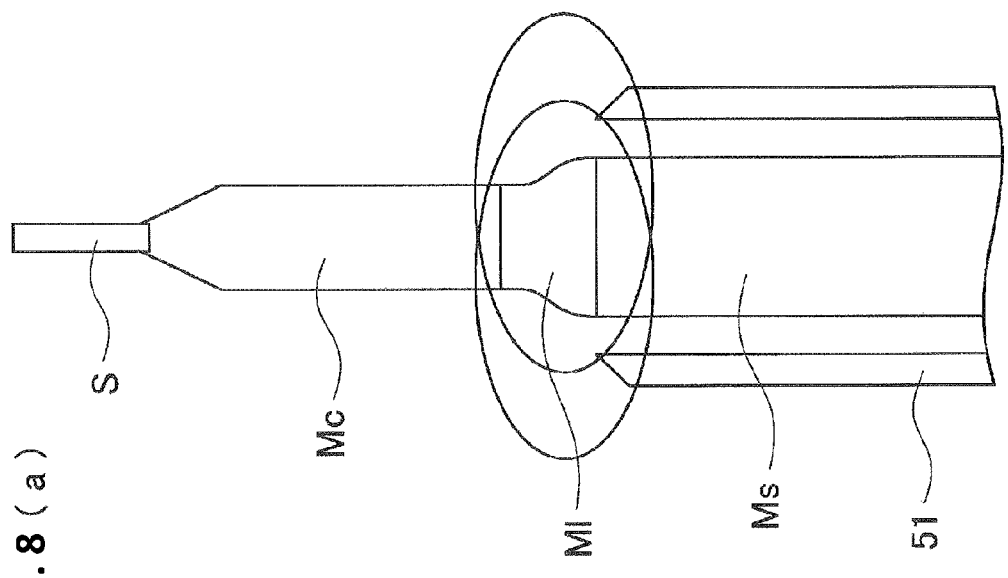

Incidentally, in <1. Single crystal production apparatus 1>, explanation is given for a case in which the infrared generating part 41 is disposed in more upper part than the melting zone M1, and in this case, the temperature gradient of the growth portion Mc becomes gradual, and therefore the high quality single crystal is obtained. In addition to this effect, the following effect is also exhibited. This point will be described using FIG. 8. FIG. 8 is a schematic cross-sectional view showing a state of the single crystal growth step in the single crystal production method according to this embodiment, wherein (a) is a schematic cross-sectional view when the infrared generating part 41 is disposed at a horizontal position of the melting zone M1, and (b) is a schematic cross-sectional view when the infrared generating part 41 is disposed in more upper part than the melting zone M1.

When assuming the case of horizontally disposing the spheroidal mirror 42 as shown in FIG. 8(a), much of the infrared is shielded by the infrared control panel 51. Even if the notch 53 is provided on the infrared control panel 51, a remarkable reduction of the irradiation amount of the infrared cannot be prevented. This is a new subject found by the inventors of the present invention.

Meanwhile, as shown in FIG. 8(b), when the infrared generating part 41 is disposed in more upper part than the melting zone M1, almost no infrared is shielded by the infrared control panel 51. Therefore, an irradiation efficiency of the infrared can be remarkably improved.

The above mentioned subject and effect are found by the inventors of the present invention by fabricating the single crystal production apparatus 1 including the infrared shielding part 5 and actually operating this single crystal production apparatus 1.

3. Effect of this Embodiment

According to this embodiment, the following effect is exhibited.

First, conventionally, the floating zone method using an infrared lamp involves a problem that the "sagging from the melting zone M1" occurs. Then, in order to prevent such a sagging from occurring, spot heating is performed by laser beams.

However, when the technique of this embodiment is used, by disposing the seed crystal S at the vertically top position, and disposing the raw material M at the vertically bottom position, it becomes possible to completely eliminate the risk of the sagging from the melting zone M1 extending to the seed crystal S.

In addition, when the technique of this embodiment is used, it also becomes possible to cancel the limit in the conventional floating zone method. As an example, when the risk of the sagging from the melting zone M1 extending to the seed crystal S can be completely eliminated, it is no problem that the melting zone M1 is expanded or long to some extent. As a result, there is no necessity for making the steep temperature gradient on the solid-liquid interface. As a result, the above mentioned preferable embodiment can be employed. As an example, by making the gradual temperature gradient between the melting zone M1 and the solid portion Ms in the raw material M, the high quality single crystal can be produced relatively easily while using the floating zone method.

So to speak, this embodiment is a key point for employing the above mentioned various preferred examples.

Further, according to this embodiment, the effect corresponding to problem 1 and problem 2 described in the problem of the present invention, can be exhibited.

(Effect 1) Since the laser light source is not required, the single crystal production apparatus 1 is inexpensive. Further, by forming the raw material M into not the rod-shape but the pellet shape, the production cost of the single crystal becomes low.

(Effect 2) Since the seed crystal S is disposed in the upper part, there is no case of damaging the seed crystal S when the single crystal is grown while maintaining the melting zone M1. Further, by providing the infrared shielding part 5 as a preferred example, cracking of the raw material M or damage of the apparatus can be suppressed, and a degree of depending on the skill during production of the single crystal can be reduced. Further, by disposing the infrared generating part 41 in the upper part of the melting zone M1, the high quality single crystal can be relatively easily produced.

As a result, in recent years, the single crystal production apparatus 1 has been popular not only in Japan but also in overseas including Asia, mainly in a research institute. Under such a circumstance, the above mentioned effect can be exhibited.

Further, it becomes possible to meet the needs enough even in a case in which the single crystal production apparatus 1 is required for a low-volume production for a physical research of the single crystal or a prototype of the single crystal product, etc. As a result, this embodiment can contribute to promoting the physical research of the single crystal or a development of a new single crystal product.

Even if research institutions of the counties overseas purchase the single crystal production apparatus 1 in which the laser beam is used, the risk of damaging the seed crystal S in the lower part can be eliminated without requiring the skill of a high degree.

Further, according to this embodiment, the effect corresponding to problem 3 and problem 4 described in the problem of the present invention can be exhibited.

(Effect 3) The floating zone method by the infrared makes it possible to make the gradual temperature gradient of the crystal growth portion, and a high quality crystal growth can be realized.

(Effect 4) The floating zone method by the infrared makes it possible to have a large light converging area, a large diameter of the raw material, and consequently a large diameter of the single crystal after growth.

That is, requests of recent years such as a request for improving a quality level desired for the single crystal, and a request for making a large size of the single crystal desired in precision instruments, can be satisfied by this embodiment.

As described above, according to this embodiment, by using the infrared and not using the crucible, the production cost of the single crystal can be remarkably reduced, and even if the raw material M is melted using the infrared, the melted raw material M does not sag extending to the seed crystal S, and a relatively high quality single crystal can be easily produced.

4. Modified Example, Etc.

A technical range of the present invention is not limited to the above mentioned embodiments, and includes various modifications and improvements in a range of deriving a specific effect obtained by constituting features of the invention and a combination of them.

(Embodiment other than the Notch 53 in the Infrared Control Panel 51)

In the above mentioned embodiment, explanation is given for a case in which a plurality of notches 53 are formed on the upper edge of the infrared control panel 51. These notches 53 are provided for securing to some extent an exposed area of the solid portion Ms of the raw material M surrounded by the infrared control panel 51. On the other hand, when the exposed area of the solid portion Ms is secured to some extent, processing other than the notch 53 may be performed to the infrared control panel 51.

By gradually shielding the infrared from the melted portion of the raw material M toward the vertically bottom position, the temperature gradient of the raw material M can be freely alleviated, and such an example of the infrared control panel 51 will be listed as follows.

First, in the above mentioned embodiment, the infrared control panel 51 has two portions of the portion where the notch 53 is provided, and the portion where the notch 53 is not provided. That is, it is a first stage that makes the gradual temperature gradient between the portion where the raw material M is completely exposed, and the portion where the raw material M is completely surrounded by the infrared control panel 51.

On the other hand, as another example, it is also conceivable that the gradual temperature gradient is made in a second stage or in a stage more than the second stage.

Figure 9:
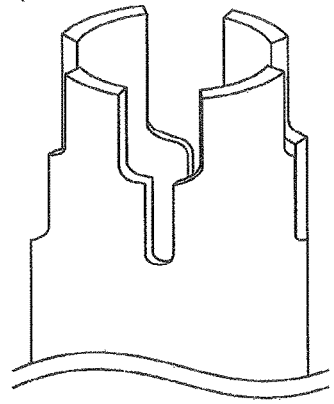
FIG. 9 is a schematic side view showing a modified example of the infrared shielding part.
Figure 9:
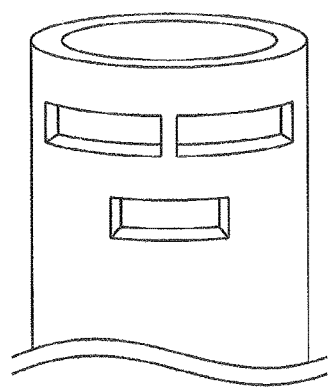
Figure 9:
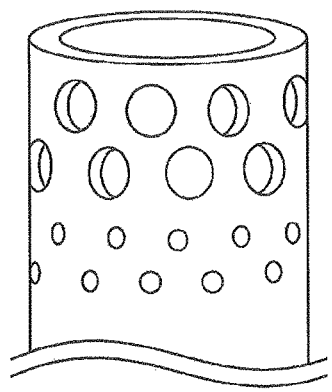
Figure 9:
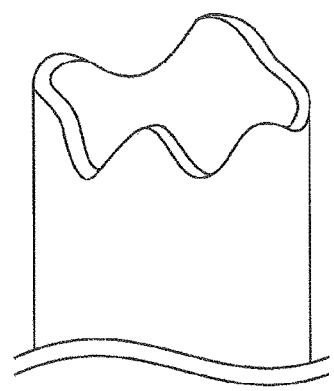
Figure 9:
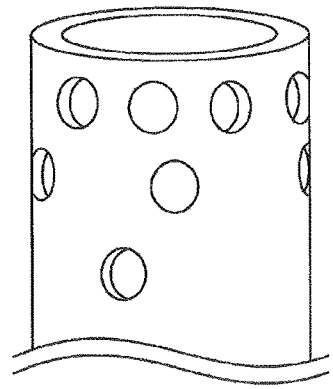

As shown in FIG. 9(a), a relatively large notch 53 is provided on the upper edge of the infrared control panel 51, and also a relatively small notch 53 may be provided in the lower part of this notch 53.

Further, as shown in FIG. 9(b), not the notch 53 but the hole may be provided. For example, a horizontal slit is formed in the upper part (first stage) of the infrared control panel 51, and a processing of reducing the number of the slits may be performed in the lower part (second stage) of the infrared control panel 51. Further, as shown in FIG. 9(c), not the slit but the hole may be provided.

Also, the size, the number, and the shape of the hole may be suitably changed, if the gradual temperature gradient can be made.

More specifically, alleviation of the temperature gradient is not performed gradually, but may be performed continuously from the melting zone M1 toward the lower part. For example, as shown in FIG. 9(d), when the notch 53 is provided on the upper edge of the infrared control panel 51, processing of continuously making a small width of the notch 53 may be performed from the upper part to the lower part. Further, as shown in FIG. 9(e), when the notch 53 is not provided, the number of the holes may be reduced from the upper part to the lower part. Of course, the size of the hole may be gradually decreased. In this case as well, the size, the number, and the shape of the notch 53 or the hole may be suitably changed, if the temperature gradient can be alleviated.

Further, the infrared control panel 51 may be constituted so that the upper edge of the infrared control panel 51 may be made of a member having a relatively low infrared shielding power, and on the other hand, the other portion may be made of a member having a relatively high infrared shielding power. Thus, the gradual temperature gradient can be realized as follows: portion completely exposed to the infrared→a high temperature portion to some extent because the infrared shielding power is low, although surrounded by the infrared control panel 51→a low temperature portion because being surrounded by the infrared control panel 51 having a high infrared shielding power.

Each of the above mentioned modified examples may be applied to the above mentioned embodiment, or the combination of them may be applied to the above mentioned embodiment.

(Handling of the Infrared Shielding Part 5 when not being Affected by Irradiation of the Infrared)

The present invention is based on the use of the infrared generating part 41. On the other hand, the function of the infrared shielding part 5 described in the above mentioned embodiment, namely, the function of "making the temperature gradient of the raw material M from the melted portion of the raw material M toward the vertically bottom position" itself is a completely opposite technical concept to the conventional concept. Therefore, if this function is focused, this function is completely different from the function of the single crystal growth device when using the laser beam as described in patent documents 2 and 3, and is a considerably difficult function from the description of the patent documents 2 and 3.

Therefore, the configuration achieved by the inventors of the present invention by focusing on this function is as follows. "The single crystal production apparatus 1 is provided for producing the single crystal by vertically disposing the raw material grip portion 2 and the seed crystal grip portion 3 mutually in the vertical direction and making them approached to each other, and making the raw material M gripped by the raw material grip portion 2 and the seed crystal S gripped by the seed crystal grip portion 3 approached to each other, and heating the raw material M by the heating part 4, and making the melted portion and the seed crystal S in contact with each other so that the melting zone M1 is formed, and cooling the melting zone M1, and in this single crystal production apparatus 1, the heating part 4 has a laser beam generating part; the seed crystal grip portion 3 is disposed at the vertically top position, and the raw material grip portion 2 is disposed at the vertically bottom position, wherein at least a part of the raw material M gripped by the raw material grip portion 2 is freely surrounded in the horizontal direction, and the laser beam generated from the laser beam generating part and emitted to the raw material M is gradually shielded from the melted portion of the raw material M toward the vertically bottom direction, to thereby make the gradual temperature gradient of the raw material M.

Note that in this specification, the "infrared shielding part 5" may be called a "temperature gradient alleviation part". Similarly, the "infrared control panel 51" may be called an "irradiation amount control panel". Further, problem 2 described in the problem of the present invention still exists as the problem regarding the above mentioned content. The effects described in the above mentioned 1-E) Infrared shielding part 5 and 2-C) Single crystal growth step, can be exhibited as the effect of the present invention.

DESCRIPTION OF SIGNS AND NUMERALS

1 Single crystal production apparatus
11 Quartz core tube
12 Lower shaft flange
13 Upper shaft flange
14 Atmosphere inlet port
15 Atmosphere outlet port
2 Raw material grip portion
21 Raw material holder
211 Raw material base
212 Holder
213 Cramp
214 Screw
215 Washer
216 Fastener
22 Lower shaft
3 Seed crystal grip portion
31 Seed crystal holder
32 Upper shaft
4 Heating part
41 Infrared generating part
42 Reflection unit (spheroidal mirror)
5 Infrared control panel
52 Floor
53 Notch
54 Taper
M Raw material
Ms Solid portion
M1 Melting zone
Mc Growth portion (single crystal)
S Seed crystal

The invention claimed is:

1. A single crystal production, apparatus, which is configured to produce a single crystal by approaching a raw material gripped by a raw material grip portion, and a seed crystal gripped by a seed crystal grip portion by disposing the raw material grip portion and the seed crystal grip portion mutually in a vertical direction and approaching both of them each other, and forming a melting zone by a heating part and cooling the melting zone, the apparatus including an infrared shielding part freely surrounding at least a part of the raw material gripped by the raw material grip portion in a horizontal direction, and freely alleviating a temperature gradient of the raw material by gradually shielding an infrared emitted from the infrared generating part for irradiating the raw material from a melted portion of the raw material toward a vertically bottom direction, wherein the heating part includes an infrared generating part, the seed crystal grip portion is disposed at a vertically top position, and the raw material grip portion is disposed at a vertically bottom position.

2. The single crystal production apparatus according to claim 1, wherein a plurality of notches are formed on a vertically top side edge of the infrared shielding part, and the notches are formed at symmetrical positions with the raw material grip portion as a center when viewing the infrared shielding part from a vertically top direction.

3. A single crystal production, apparatus, which is configured to produce a single crystal by approaching a raw material gripped by a raw material grip portion, and a seed crystal gripped by a seed crystal grip portion by disposing the raw material grip portion and the seed crystal rip portion mutually in a vertical direction and approaching both of them each other, and forming a melting zone by a heating part and cooling the melting zone, wherein the seed crystal grip portion is disposed at a vertically top position, and the raw material grip portion is disposed at a vertically bottom position, wherein the heating part includes a plurality of the infrared generating parts, and includes a plurality of spheroidal mirrors as reflecting parts having common focal points, with one of the focal points present in a vertically top direction viewed from the common focal points, and the infrared generating part is disposed at an other focal points, and wherein each of the infrared generating parts is positioned on an upper focal point of spheroidal mirrors.

4. The single crystal production apparatus according to claim 3, wherein the raw material grip portion has a shape engageable with a pellet-like raw material, and the seed crystal grip portion has a shape capable of griping a rod-like seed crystal.

5. The single crystal production apparatus according to claim 4, wherein the raw material grip portion can freely grip the raw material which is cylindrical and has a diameter of 10 mm or more, and a diameter of a produced single crystal is 1 mm or more.

6. A single crystal production method for producing a single crystal by forming a melting zone after a raw material and a seed crystal are disposed mutually in a vertical direction and cooling the melting zone, the method comprising:

when disposing the seed crystal at a vertically top position,
disposing the raw material at a vertically bottom position; and
melting the raw material by irradiation of an infrared,
an infrared shielding part surrounding at least a part of the raw material gripped by a raw material grip portion in a horizontal direction, and alleviation a temperature gradient of the raw material by gradually shielding an infrared emitted from an infrared generating part for irradiating the raw material, from a melted portion of the raw material toward the vertically bottom position.

7. A single crystal production method for producing a single crystal by forming a melting zone after a raw material and a seed crystal are disposed mutually in a vertical direction and cooling the melting zone, the method comprising:

when disposing the seed crystal at a vertically top position,
disposing the raw material at a vertically bottom position; and
melting the raw material by irradiation of an infrared using a heating part,
the heating part including a plurality of infrared generating parts, and a plurality of spheroidal mirrors as reflecting parts having common focal points, with one of the focal points present in a vertically top direction viewed from common focal points, and the infrared generating part is disposed at an other focal point, and
each of the infrared generating parts being positioned on an upper focal point of spheroidal mirrors.

8. The single crystal production method according to claim 7, wherein the infrared generating parts are disposed at an upper position by 15 degrees to 45 degrees, viewed from a horizontal direction of the melting zone of the raw material.

9. The single crystal production apparatus according to claim 3, wherein the infrared generating parts are disposed at an upper position by 15 degrees to 45 degrees, viewed from a horizontal direction of the melting zone of the raw material.

* * * * *